United States Patent [19]

Thiem et al.

[11] Patent Number: 4,546,325

[45] Date of Patent: Oct. 8, 1985

[54] FAST-ACTING TUNER FOR MULTIPLE-CHANNEL KLYSTRONS

[75] Inventors: Carol J. Thiem, Mountain View; Gordon R. Lavering, Belmont; Gerald A. Valier, Los Altos, all of Calif.

[73] Assignee: Varian Associates, Inc., Palo Alto, Calif.

[21] Appl. No.: 655,842

[22] Filed: Sep. 28, 1984

[51] Int. Cl.[4] .......................... H03F 3/56; H03B 27/00; H01J 25/10

[52] U.S. Cl. .......................................... 330/45; 331/83; 315/5.47

[58] Field of Search ................ 331/83; 315/5.46, 5.48, 315/5.53, 5.54, 5.47; 330/45

[56] References Cited

U.S. PATENT DOCUMENTS

| | | | |
|---|---|---|---|
| 3,132,280 | 5/1964 | Schmidt | 315/5.47 |
| 3,617,799 | 11/1971 | Schmidt | 315/5.47 |
| 3,987,332 | 10/1976 | Convery | 315/5.47 |

*Primary Examiner*—Eugene LaRoche
*Assistant Examiner*—G. Wan
*Attorney, Agent, or Firm*—Stanley Z. Cole; Kenneth L. Warsh

[57] ABSTRACT

A cylinder or barrel fitted with cams is used to limit the outward movement of spring-loaded plungers attached to cavity shorting bars in a klystron. Different tunings of the klystron are achieved by rotating the cylinder so that different rows of cams limit the plungers. A linear solenoid is used to decouple the plungers from the cams before rotation. A stepping solenoid is used to move the cylinder from one setting to another.

4 Claims, 4 Drawing Figures

FAST-ACTING TUNER FOR MULTIPLE-CHANNEL KLYSTRONS

FIELD OF THE INVENTION

This invention pertains to a solenoid-driven remote tuner for rapidly tuning a klystron amplifier.

BACKGROUND OF THE INVENTION

Tuning of cavities in a klystron is accomplished by adjusting inductive shorting bars that are internal to the cavity assemblies within the vacuum envelope. The shorting bars are moved by pushing or pulling plungers which enter the cavities through hermetic bellows.

A tuner is a device for operating the plungers of a klystron so that the klystron can be precisely and repeatedly tuned to certain preselected channel frequencies within a band of frequencies. Examples of prior art tuners are shown in U.S. patents Nos., 3,132,280 and 3,617,799, both assigned to the assignee of the subject invention.

OBJECTS OF THE INVENTION

It is an object of the invention to provide a tuner for a klystron which allows rapid changing of preselected channels of frequencies.

It is a further object to provide in such a tuner means for preventing damage to the klystron if the channel tuning is grossly misadjusted.

BRIEF SUMMARY OF THE INVENTION

The tuner of the invention is an electromechanical device that is driven by two solenoids. One is a linear acting solenoid and the second is a limited rotation stepper solenoid. Power is applied to the solenoids only while changing channels.

A cylinder or barrel is fitted with set screws which function as cams. The cams are set in rows parallel to the axis of the cylinder with one cam for each plunger. Several rows of cams are spaced around the cylinder. Each row is adjusted for a different channel by adjusting the extension of each of the cams of that row.

In operation the linear solenoid is first activated to move all the plungers away from the cams. Then the stepper solenoid is used to rotate the cylinder so that the desired row of cams is positioned over the plungers. Then the linear solenoid releases the plungers to rest on the cams. Stops are used on the tuner to prevent damaging the plunger if the cams are not adjusted appropriately.

The simplicity of this tuner permits rapid changing of the channels of the klystron. Any new channel of six in a test model could be changed in less than 2.0 seconds. A new channel tuned by an adjacent row of cams could be selected in less than one second.

These and further constructional and operational characteristics of the invention will be more evident from the detailed description given hereinafter with reference to the figures of the accompanying drawings which illustrate preferred embodiments and alternatives by way of non-limiting examples.

DETAILED DESCRIPTION OF THE PREFERRED EMBODIMENTS

Figure 1:
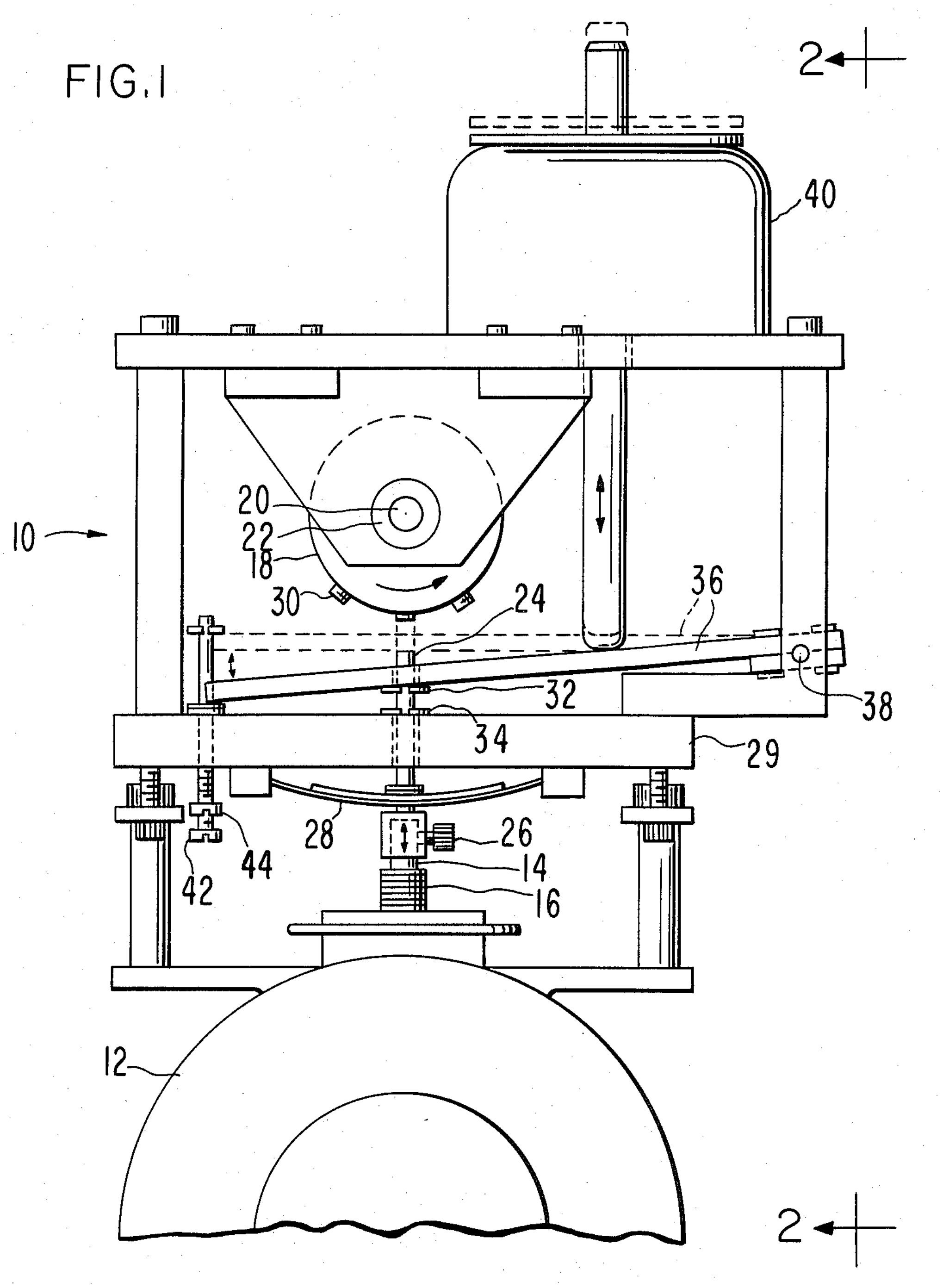
FIG. 1 is an end view of the tuner of the invention on top of the klystron.
Figure 2:
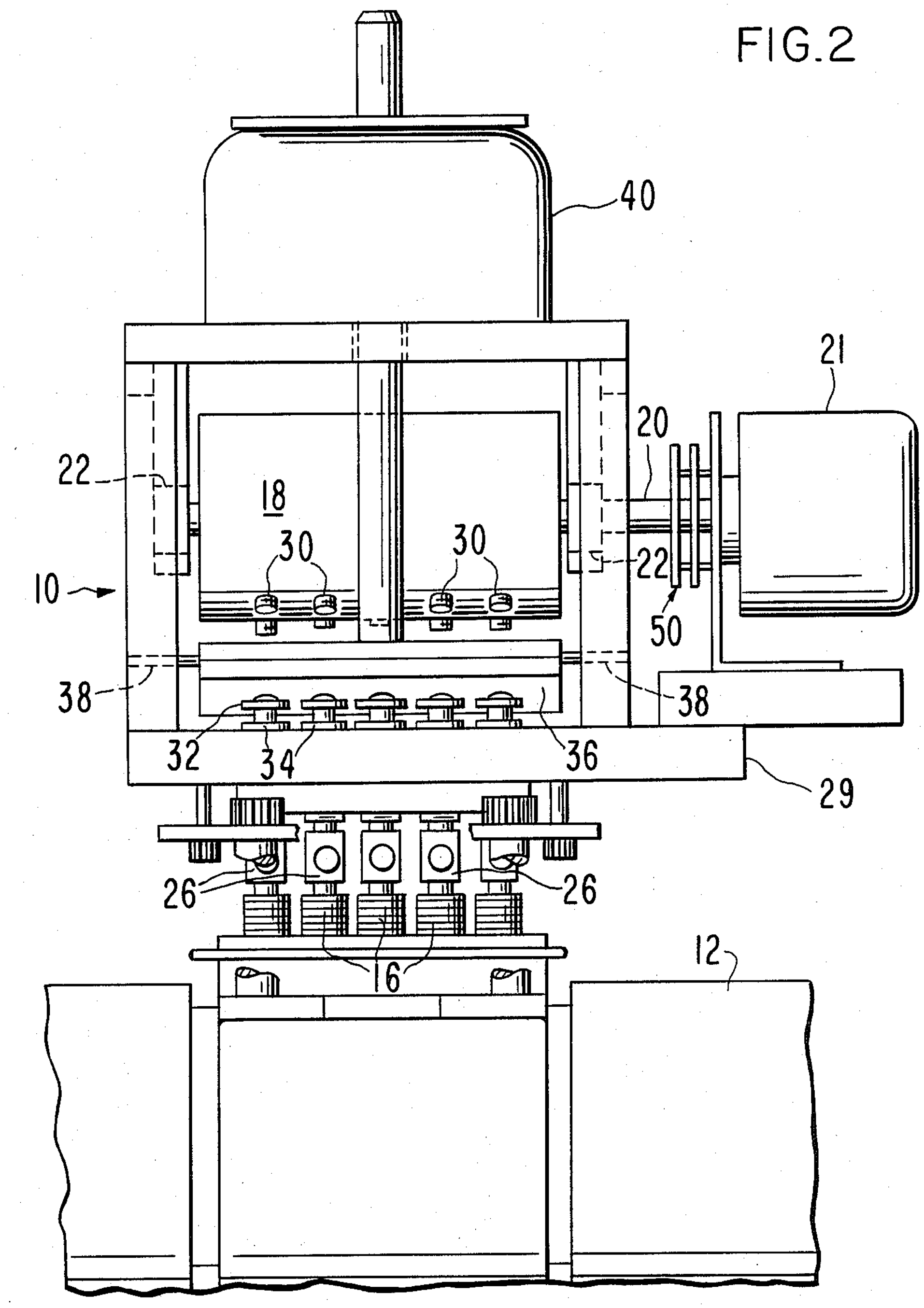
FIG. 2 is a side view of the tuner of the invention on top of the klystron.
Figure 3:
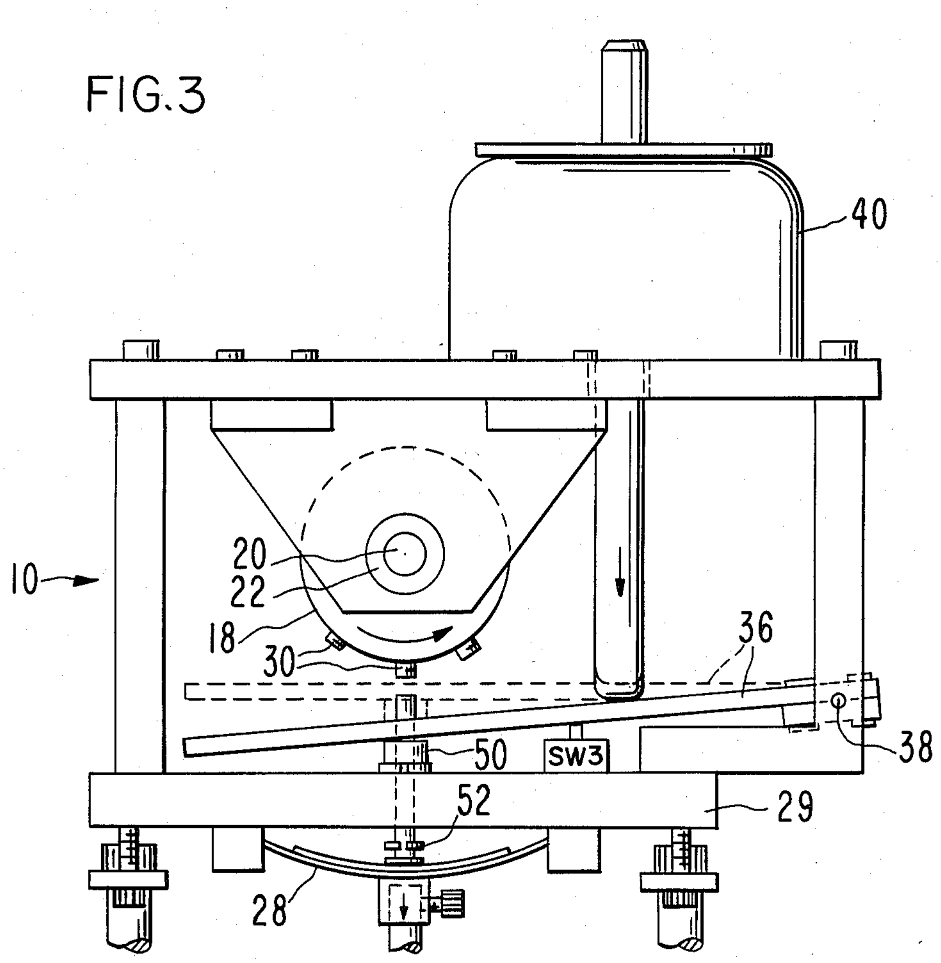
FIG. 3 is another end view of the tuner of the invention illustrating a different embodiment of the stops used to limit plunger excursions.

Referring now to the drawings wherein reference numerals are used to designate parts throughout the various figures thereof, there is shown in FIGS. 1-3 end and side views of the tuner 10 of the invention mounted on a klystron 12. The klystron 12 has several plungers 14 which enter the klystron cavity through hermetic bellows 16. The plungers 14 are connected to inductive shorting bars internal to the tuning cavities of the klystron.

A cam carrier cylinder 18 is mounted with its axis of symmetry parallel to the axis of the beam of the klystron above the plungers. There is a shaft 20 for rotation of the cylinder 18 along the axis of symmetry. Bearings 22 for support of the shaft 20 are located near each end of the cylinder 18. A stepper or limited rotation solenoid 21 is connected to the shaft 20. The plungers 14 are extended upward with extensions 24 and couplers 26, hereinafter treated as part of the plungers 14. Return springs 28 mounted on a spring support plate 29 are used to urge the plungers 14 upward. Static set screws or cams 30 are mounted on the cylinder 18 so as to limit the upward excursion of the plungers 14. As shown in FIG. 2, the set screws are pre-set to different extensions so that the klystron cavities will be properly tuned for the given channel associated with the row. C-rings 32 and 34 are mounted on the plunger extensions 24 and a compression plate 36 having a pivot 38 at one end is used to force the C-ring 32, and the plunger 14 downward away from cams 30. The compression plate 36 is driven downward by a linear solenoid 40. In FIG. 1 the compression plate 36 and the plunger 14 are shown in the downward position in solid lines and in the upward position in dotted lines.

The quick-acting tuner is a passive device using no power when the klystron is operating and no channel changing is occurring. To change channels, the klystron's RF power is first turned OFF, the linear solenoid 40 is energized which causes the compression plate 36 to force the plungers 14 out of contact with the cams 30 mounted on the cylinder 18. There is now no plunger/cam contact, and the cylinder 18 is rotated by the stepper solenoid 21 so that a new row of pre-adjusted set screw cams 30 are aligned with the plungers 14. The power to the linear solenoid 40 is turned off and the plungers 14 return with the action of the springs 28. The plungers 14 then reengage a selected row of cams 30 and adjust to their new static operating positions. The klystron cavities have thereby been adjusted to a new tuning. The RF is again applied.

The linear solenoid 40 is activated prior to rotation of the cylinder 18 to clear the plungers 14 so that even the longest set screw 30 will pass during rotation unobstructed by the contact end of the plunger 14.

In one preferred embodiment of FIG. 1, two screws 42 and 44 tapped into the spring plate 29 and carrying rubber covered stops are used to provide adjustable upper and lower limits to the excursion of the compression plate 36. By this means hypercompression of the klystron bellows and overstressing of the return springs cannot occur.

In another alternate embodiment shown in FIG. 3, a rubber stop 50 is used to limit the downward excursion of the compression plate and a C-ring 52 is used to limit its upward excursion.

Figure 4:
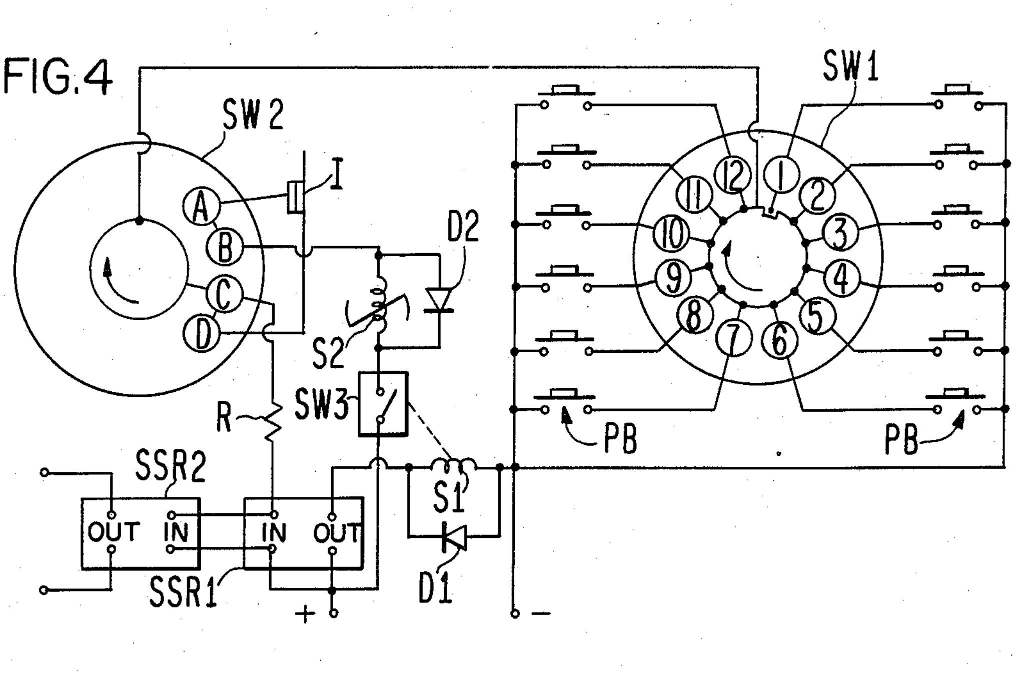
FIG. 4 is a schematic of the circuit used with the tuner of the invention.

A special switch, used in the circuit of FIG. 4, consists of two interconnected decks mounted on the shaft 22 of the stepper solenoid 21. One deck of the special switch is a notch control switch deck SW1. The second deck is an interrupter switch SW2. The channels are selected by pushing one of the pushbuttons PB corresponding to the desired channel. A ring shown at the center of the diagram of the notch control switch deck in FIG. 4 is connected to the ring at the center of the diagram of the interrupter switch SW2 in FIG. 4. Pushing a pushbutton PB will thus connect the negative terminal of the power supply through the notch control switch deck SW1 to the contact C on the interrupter switch SW2, and through a resistor R to a solid state relay SSR1. The solid state relay SSR1 then closes connecting the positive side of the power supply to coil S1 of the solenoid 40. There is an arc-suppressing diode D1 connected across the coil S1. Switch SW3 is mechanically activated by solenoid 40 so that as the coil S1 is activated the switch SW3 applies positive voltage from the power supply to the coil S2 of the stepper solenoid 21. A second relay SSR2 can be used to disconnect the RF signal, such a relay being controlled by the same signal that activates the first solid state relay SSR1. There is an arc-suppressing diode D2 across the coil S2. The other side of the coil S2 is connected to an interrupter I and through the interrupter switch deck SW2 and notch control switch deck SW1 to the negative voltage of the power supply.

The interrupter I is mechanically synchronized to the action of the solenoid 21 by a cam (not shown). Normally closed when the solenoid is de-energized, the interrupter is opened by the cam as the solenoid 21 reaches the last few degrees of its forward stroke, thus cutting the power. A built-in scroll spring returns the solenoid to its starting position. During the last few degrees of the return stroke the interruper I closes and the cycle repeats. This operation is similar to a doorbell buzzer.

When control applications require a method of finding the wire with the power applied to it, notch type selection is commonly used. In simplest form the rotor of a notch type control deck is a continuous segment having only one notch, with the common of the rotor electrically connected through the circuit interrupter to the solenoid. When power is applied to any clip touching the rotor, it is conducted through the common clip and the interrupter to the solenoid; the switch then advances automatically until the notch reaches the selected clip, deenergizing the circuit until power is applied to another station.

This invention is not limited to the preferred embodiments heretofore described, to which variations and improvements may be made without leaving the scope of protection of the present patent, the characteristics of which are summarized in the following claims.

What is claimed is:

1. A multicavity klystron amplifier comprising:

a vacuum-tight klystron body, a gun for generating a linear beam of electrons, a plurality of resonant cavities arrayed sequentially along the axis of said beam, a collector for catching said beam downstream of said cavities, passageways for conducting said beam through said cavities into said collector, a transmission line for introducing an input signal into a first of said cavities, a transmission line for extracting an amplified output signal from a last of said cavities, a movable tuner member in each of said cavities, means for remotely controlled, simultaneous resetting of the resonant frequencies of said cavities to change the frequency passband of said amplifier, said resetting means comprising:

a parallel array of plungers, each attached to one of said tuners, said plungers being movable on mutually parallel axes perpendicular to said beam axis, a spring engaging each said plunger for forcing said plunger away from said klystron body, a compression plate, movable with respect to said body, adapted to engage all of said plungers to force said plungers toward said body, a linear actuator adapted to force said compression plate toward said body, a cam carrier rigidly mounted with respect to said body, but rotatable about a cam carrier axis perpendicularly intersecting the axes of motion of said plungers, a plurality of rows of cams, each row aligned parallel to said cam carrier axis and spaced such that when said row is rotated into the plane of said plungers, one cam of each set is aligned to contact one of said plungers, each of said cams being adjustable in its extent from said cam carrier axis, a stepwise actuator for rotating said cam carrier to bring different sets of cams onto said axis of cam follower motion, control means for said frequency resetting, including means for controlling the steps of:

energizing said linear actuator to force said plungers away from said cams, energizing said stepwise actuator to rotate a desired set of cams into said axis of said plungers, de-energizing said linear actuator whereby said springs force said plungers into contact with said desired cams.

2. A multicavity klystron amplifier as in claim 1 wherein a notch control switch is used to select said desired set of cams.

3. A tuner for a multicavity klystron defining a plurality of resonant cavities aligned side by side along a main axis, each cavity being provided with tuning means including a plunger extending outwardly and movable generally perpendicularly to said axis, said tuner comprising:

a cam carrier rotatably mounted in fixed relationship with an amplifier, said carrier defining an axis of rotation generally parallel to said amplifier axis;

a plurality of cam rows mounted on said cam carrier, each row including a plurality of cams, each cam extending radially and perpendicularly to said carrier axis, the cams of each row being aligned side by side in a direction parallel to said carrier axis, the number of cams in each row corresponding generally with the number of said plungers, each cam being adjustably mounted in said carrier to permit its radial extension from said carrier axis to be individually preset, the cams of each said row being successively alignable with respective ones of said tuning rods upon appropriate rotation of said cam carrier;

spring means engaging each of said plungers for biasing said plungers against the cams of a cam row;

means for collectively and instantly releasing all of said plungers from said cam row, including a compression plate positioned between said cam carrier and klystron, and adopted to engage all of said plungers, said plate being mounted to permit movement toward and away from said cam carrier, and a linear actuator responsive to a control signal for forcing said member away from said cam carrier in opposition to said spring means;

whereby said plungers may all be disengaged from said cams on command, the unloaded cam carrier rotated to a line a further row of cams with said plungers, and said plungers released into simultaneous engagement with said further cam row, thus enabling the tuning of said klystron rapidly and reliably between different frequency channels predetermined by the setting of said cams.

4. A tuner for a multicavity klystron as in claim 3 wherein a notch control switch is used to select said frequency channels predetermined by the setting of said cams.

* * * * *